(12) United States Patent
Kim et al.

(10) Patent No.: US 6,352,454 B1
(45) Date of Patent: Mar. 5, 2002

(54) WEAR-RESISTANT SPRING CONTACTS

(75) Inventors: Patrick G. Kim, Santa Clara; Donald L. Smith, Bolinas; Andrew S. Alimonda, Los Altos, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/421,389

(22) Filed: Oct. 20, 1999

(51) Int. Cl.[7] ............................................. H01R 13/02
(52) U.S. Cl. ..................... 439/886; 439/482; 324/754; 200/242; 29/874; 29/882
(58) Field of Search .................. 439/886, 887, 439/482; 324/754; 29/884, 885, 874, 882; 200/242, 267, 253

(56) References Cited

U.S. PATENT DOCUMENTS

| | | | |
|---|---|---|---|
| 3,780,247 A | * 12/1973 | Healy et al. | ............ 200/166 C |
| 3,842,189 A | 10/1974 | Southgate | |
| 5,613,861 A | 3/1997 | Smith et al. | |
| 5,665,648 A | 9/1997 | Little | |
| 5,720,098 A | * 2/1998 | Kister | .................. 29/825 |
| 5,848,685 A | 12/1998 | Smith et al. | |
| 5,944,537 A | 8/1999 | Smith et al. | |

* cited by examiner

Primary Examiner—Tho D. Ta
Assistant Examiner—Truc Nguyen
(74) Attorney, Agent, or Firm—Oliff & Berridge, PLC

(57) ABSTRACT

A spring contact includes a free portion having a tip. The free portion includes a contact surface and side surfaces. In some embodiments, a wear resistant material is formed on only selected portions of the tip. In other embodiments, the wear resistant material is formed on the contact surface and on the side surfaces. The wear resistant material increases the wear resistance of the spring contact. The spring contacts can be used in probes.

31 Claims, 6 Drawing Sheets

WEAR-RESISTANT SPRING CONTACTS

BACKGROUND OF THE INVENTION

1. Field of Invention

This invention relates to spring contacts for electrically contacting electronic devices. This invention further relates to methods of making the spring contacts.

2. Description of Related Art

Micro spring contacts have been used for various purposes in the semiconductor industry. For example, these contacts have been used for electrically connecting integrated circuits, or chips, to circuit boards and other devices using standard bonding techniques.

Spring contacts have also been used for establishing a temporary electrical contact between two devices.

Photolithographically patterned spring contacts are described in U.S. Pat. Nos. 5,613,861 and 5,848,685, each incorporated herein by reference in its entirety. The spring contacts are formed on substrates and electrically connect two devices. As shown in FIG. 1, a bonding structure 50 comprises a spring contact 60 composed of an elastic material. The spring contacts 60 can have an inherent stress gradient that causes a free portion 62 of the spring contact to bend up and away from a substrate 52. An anchor portion 64 of the spring contact 60 can be fixed to a substrate 52 and electrically connected to a first contact pad 20 on the substrate 52. The free portion 62 of the spring contact 60 includes a tip 66 that compliantly contacts a second contact pad 20 on a device 70.

FIG. 2 shows a probe card 32 including an array of the spring contacts 60. The spring contacts 60 which are aligned with contact pads 20 on the device 70 such that the spring contacts 60 compliantly contact the contact pads 20. The device 70 can then be tested or communicated with by a testing device electrically connected to the probe card 32.

Spring contacts can be used to test chips or integrated circuit devices. For example, probes including these spring contacts can be used for wafer-level and burn-in tests of devices. The spring contacts comprise spring metals and have a pointed tip at the free end of the spring contact. During testing, the spring contacts are brought into contact with the contact pads formed on chips or on various devices. The contacts pads are typically formed of aluminum. A native aluminum oxide naturally forms on the aluminum contact pads at room temperature. In order to make electrical contact with the aluminum contact pads, the pointed tip of the spring contacts must penetrate through the native oxide.

When the spring contacts are used in probe cards for testing integrated circuit devices, the tip is repeatedly brought into contact with the aluminum contact pads. To provide a desirable service life, these spring contacts should be able to withstand approximately $3 \times 10^5$ touchdowns (contacts) with different contact pads, each having a hard native oxide on the surface that is contacted by the spring contact tip. In order to meet this need, the tip must resist wear, which can blunt the tip and, consequently, reduce its ability to penetrate the native oxide film and make electrical contact with the contact pad during repeated probing. The tip should be a good electrical conductor to reduce the degradation of electrical contact resistance and be chemically passive with contact pad materials to reduce the galling of the tip with contact pad material. That is, to reduce galling effects, spring metal should have a low solubility of the contact pad metal.

U.S. Pat. No. 5,944,537, incorporated herein by reference in its entirety, discloses spring contacts including at least a portion that can comprise a wear resistant material. In embodiments of the spring contacts, the tip can be coated with a hard material to provide wear resistance.

SUMMARY OF THE INVENTION

This invention provides improved spring contacts.

This invention separately provides devices comprising the improved spring contacts that can be used for testing purposes.

This invention separately provides methods of making the spring contacts.

Exemplary embodiments of the spring contacts according to this invention comprise a free portion composed of a spring metal. The free portion includes side surfaces, a contact surface and a tip. A wear resistant material can be formed on the side surfaces and the contact surface. The wear resistant material can be any suitable material that provides the desired wear resistance properties.

In other exemplary embodiments of the spring contacts according to this invention, the wear resistant material can be formed on only a portion of the tip. The wear resistant material can be any suitable ceramic or metal material. For example, the wear resistant material can be a carbide formed at only a portion of the tip. In other embodiments, the wear resistant material can be formed on only a portion of the contact surface. For example, the wear resistant material can be formed as a strip.

In other exemplary embodiments of the spring contacts according to this invention, the wear resistant material can be formed between adjacent spring metal layers and at least partially exposed at the tip. The wear resistant material can be any suitable ceramic or metal material.

Exemplary embodiments of devices according to this invention can comprise a plurality of any of the above-described spring contacts according to this invention. For example, the devices can be probe cards. The probe cards can be used for various testing applications of chips and electronic devices.

This invention also provides methods of making the spring contacts. In embodiments, conventional coating and photolithographic techniques can be used to make the spring contacts.

BRIEF DESCRIPTION OF THE DRAWINGS

The preferred embodiments of this invention will be described in detail, with reference to the following figures, in which.

DETAILED DESCRIPTION OF PREFERRED EMBODIMENTS

Figure 1:
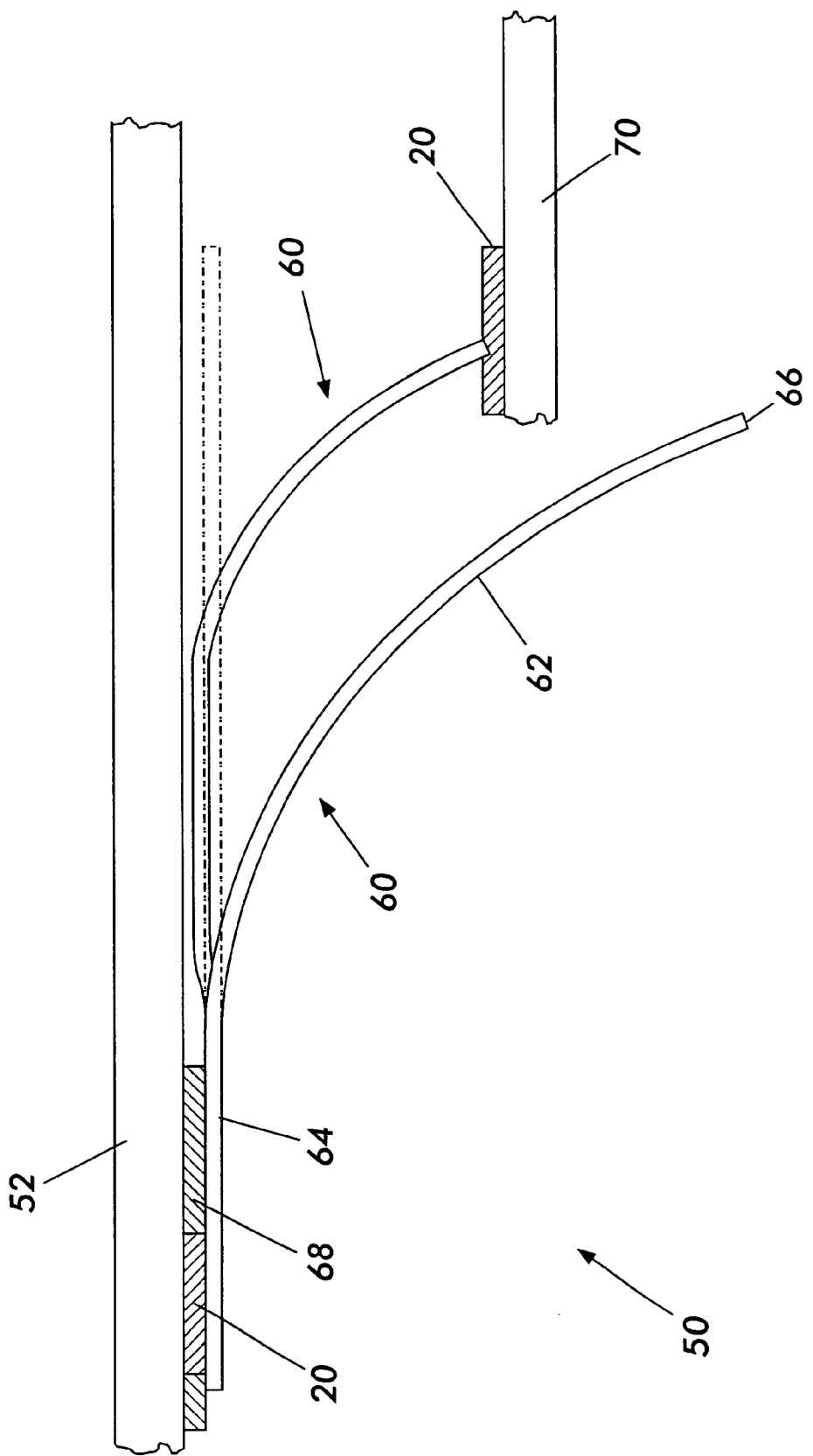
FIG. 1 depicts a known spring contact in a non-deformed free state and in a deformed state contacting a contact pad.
Figure 2:
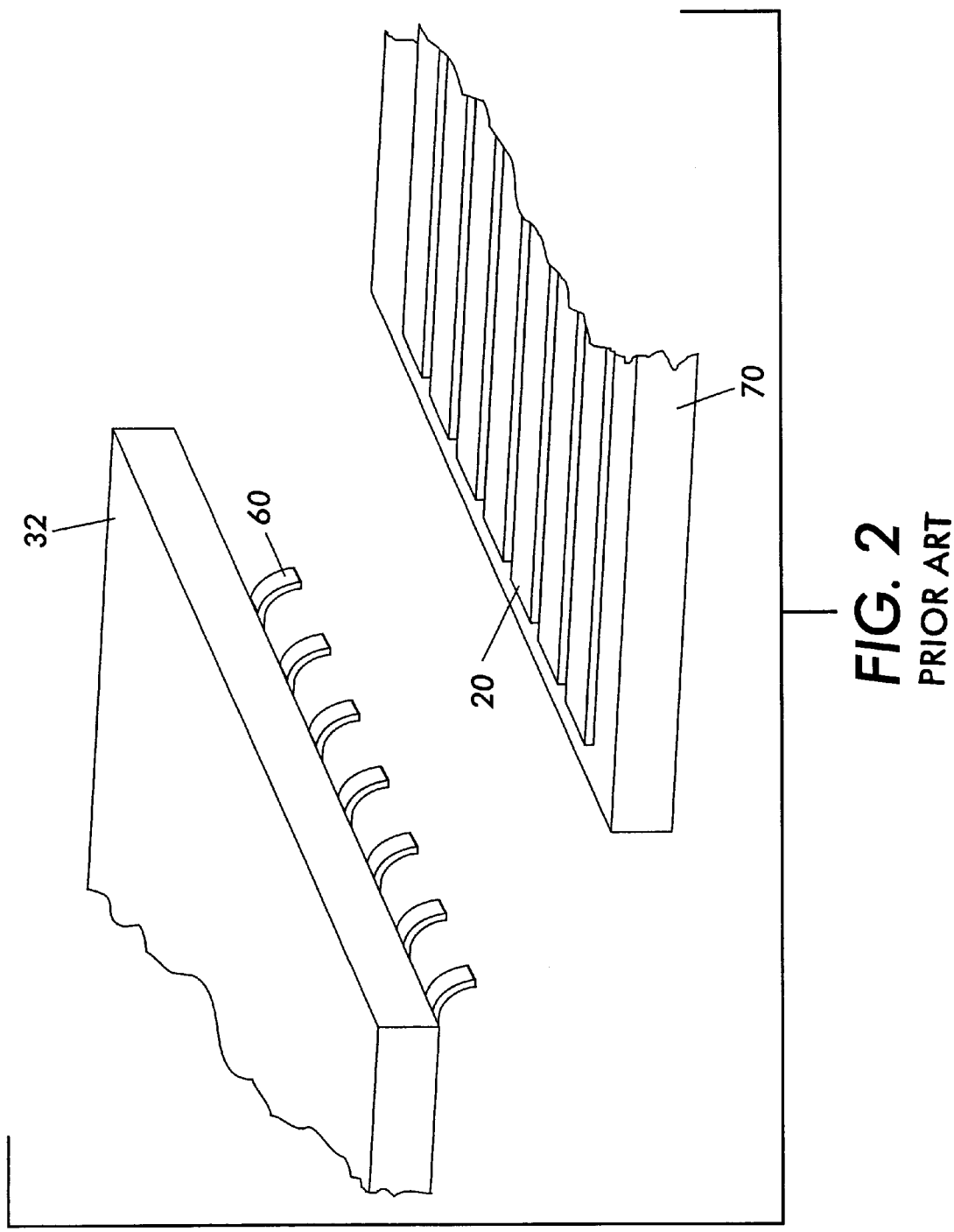
FIG. 2 shows a contacting application for the spring contact of FIG. 1.
Figure 3:
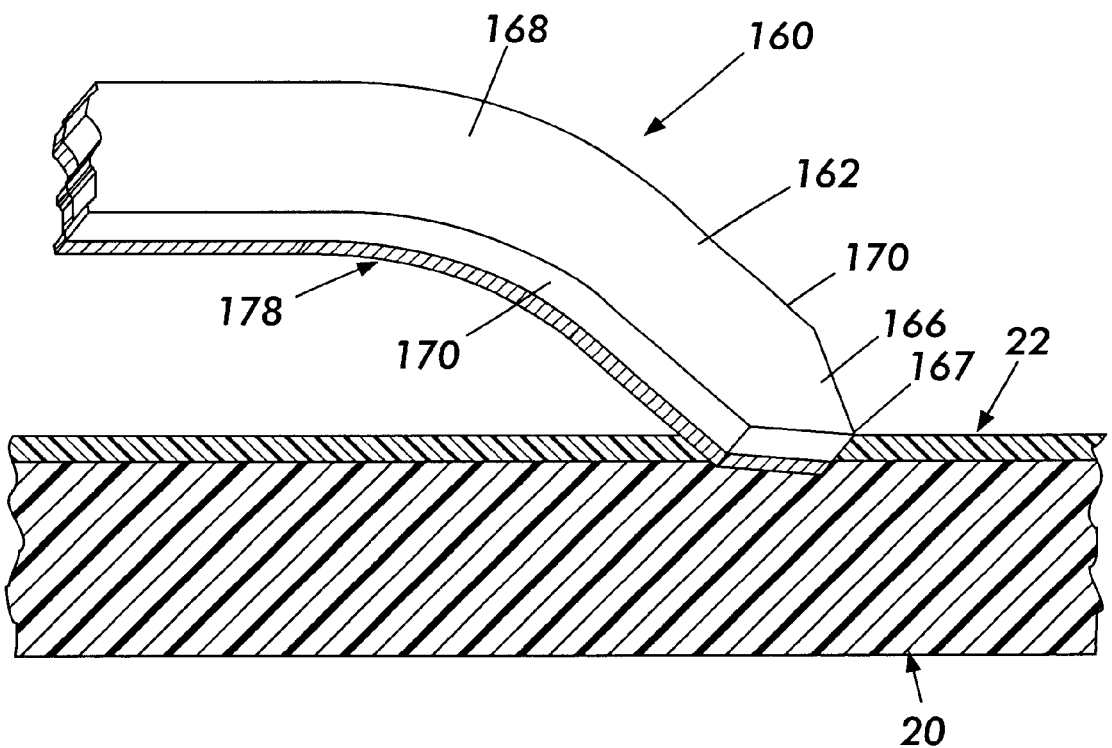
FIG. 3 illustrates an exemplary embodiment of a spring contact according to this invention including a wear resistant material formed over its contact surface, showing the tip of the spring contact penetrating through a native oxide.

An exemplary embodiment of a spring contact according to this invention is shown in FIG. 3. The spring contact 160 can have, for example, the same shape as the spring contact 60 shown in FIG. 1. For simplicity, only the free portion 162 of the spring contact 160 is shown in FIG. 1. The spring contact 160 can also comprise an anchor portion (not shown) that can have the structure as the anchor portion 64 shown in FIG. 1. The free portion 162 of the spring contact includes a top surface 168, opposed side surfaces 170 and a contact surface 172. A tip 166 is formed at an end of the free portion 162. As shown, the tip 166 can have a pointed end 167. Other tip 166 configurations, such as configurations including multiple pointed ends, can also be provided.

The tip 166 of the spring contact 160 is shown penetrating a layer 22 on a substrate. For example, the layer 22 can be a native oxide formed on a contact pad 20. The contact pad 22 can be formed on a chip or on a device such as an integrated circuit.

In embodiments of the spring contacts according to this invention, the spring contacts can be formed by photolithography. In these embodiments, the spring contact 160 comprises any suitable spring metal material that can be photolithographically patterned. The spring metal also preferably provides high elasticity to exert a mechanical force to the tip. In addition, the spring metal provides electrical connection between surfaces contacted by the opposed ends of the spring contact 160.

The spring contact 160 can be formed, for example, of any suitable extremely elastic material. Preferably, the spring contacts are formed of an extremely elastic, conductive material. However, in embodiments, the spring contacts can alternatively be formed of a non-conductive material. Suitable exemplary alloy systems for forming the spring contacts include chrome-molybdenum alloys, tungsten (W)-based alloys, chromium (Cr)-based alloys, nickel-zirconium alloys. Specific suitable alloys include, for example, nickel-zirconium alloy comprising 1% zirconium, and a chrome-molybdenum alloy comprising 20% Cr-80% Mo. In Ni—Zr alloys, zirconium improves the elastic properties of the alloy but does not greatly reduce the conductivity of the nickel. As stated above, when the elastic material is not sufficiently conductive, it can be at least partially coated with a conductive material, such as a metal or metal alloy, to provide the desired conductivity.

The spring contact has a typical width of 10–100 μm.

In accordance with this invention, a wear resistant material 178 comprises at least a portion of the free portion 162 of the spring contact 160 to enhance the wear resistance of the spring contact. The wear resistant material 178 increases the wear resistance of at least the tip 166, thereby enabling the tip 166 to more effectively penetrate hard materials.

In probing applications, to reduce wear of the tip 166 due to repeated contact and abrasion with hard native oxides on contact pads, in exemplary embodiments, at least the tip 166 of the spring contact 160 can comprise an alloy, such as an alloy based on tungsten (W) or chromium (Cr), that increases the hardness of at least the tip. By increasing the hardness of the tip, these materials enable the tip to wear at a slower rate than tips of spring contacts formed of a softer material. Tungsten and chromium can be alloyed, as described above, to reduce brittleness and increase the toughness of the spring contact 160.

In some exemplary embodiments of the spring contacts according to this invention, wear-resistant, chemically passive with contact pad materials, electrically conductive materials can be applied to selected portions of the spring metals forming the spring contacts to increase the wear resistance of those selected portions. The wear resistant material can be any suitable material that can be formed on the spring metal and provide suitable wear resistance.

Materials having high hardness can be applied to increase the wear resistance of the spring contacts. These same materials have a low solubility of contact pad materials, which can also reduce galling of the tips of the spring contacts due to contact with contact pads. For example, hard noble metals, titanium nitride (TiN) and diamond-like carbon reduce galling.

Other materials that can be applied on at least the tips of the spring contacts to reduce wear include materials that reduce friction between the tips and the contact pads without reducing the ability of the tips to scrub through hard native oxides on the contact pads. For example, molybdenum sulfide and tin dioxide have a high lubricity, and therefore can be used to reduce friction.

The wear resistant material can be selected from suitable nitrides, carbides, oxides, carbo-nitrides, suicides, hard noble metals and other materials. Exemplary nitrides include, but are not limited to, TiN and Ti—Al—N. An exemplary carbide is TiC. An exemplary oxide is $Al_2O_3$. An exemplary carbonitride is Ti—C—N. Exemplary hard metals include, but are not limited to, Rh, Ru, Re and Os. Exemplary silicides include, but are not limited to, $WSi_2$, $MoSi_2$, $TaSi_2$, $TiSi_2$.

In addition, the wear resistant material can be any suitable metal such as, for example, Mo, Mo-based alloys, W and W-based alloys. These wear resistant metal materials can be applied at selected portions of spring contacts, over less wear resistant spring metal materials that are included to provide the required elasticity to the spring contacts.

The wear resistant material 178 can have any suitable thickness that provides the desired wear resistance to the portion of the spring contact 160 at which it is applied. In addition, the wear resistant material 178 preferably does not adversely affect the physical and electrical properties of the spring contact 160. A typical thickness of the wear resistant material is from about 0.05 μm to about 0.2 μm. Preferably, this material has a thickness that is no greater than that needed to provide the desired wear resistance to the tip 166, to ensure that the coating does not significantly reduce the elasticity of the free portion 162 of the spring contact 160. Reducing the thickness of the wear resistant material also reduces any effect this material may have on the electrical conductivity of the spring contact 160.

Figure 4:
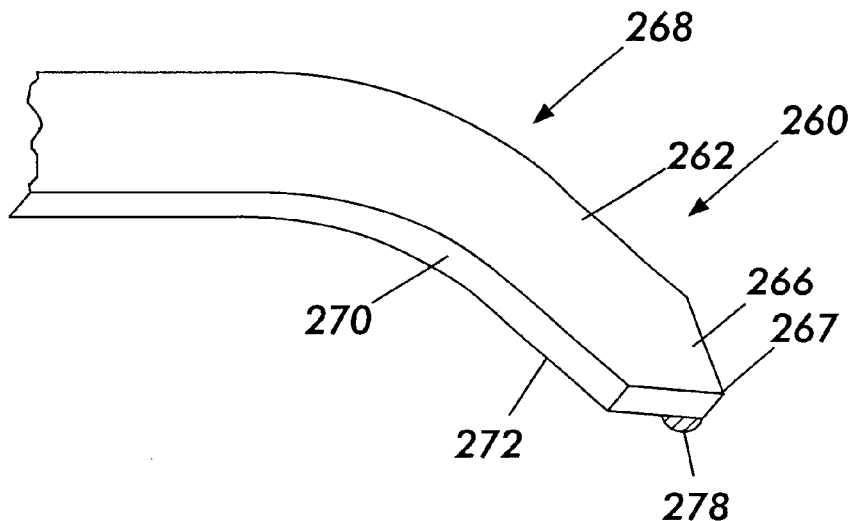
FIG. 4 illustrates another exemplary embodiment of a spring contact according to this invention having patterned wear resistant material formed over only a portion of the contact surface.
Figure 5:
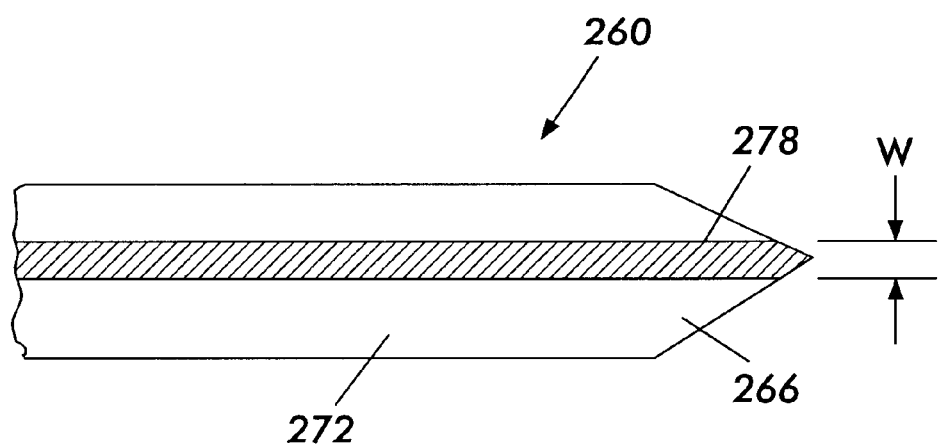
FIG. 5 is a bottom view of the spring contact of FIG. 4.

FIGS. 4 and 5 illustrate another exemplary embodiment of a spring contact 260 according to this invention. The spring contact 260 comprises a wear resistant material 278 formed over only a selected portion of the contact surface 272 that contacts a contact pad or other surface. In this embodiment, the wear resistant material 278 has a strip configuration and extends longitudinally from the pointed end of the tip 266.

Forming the wear resistant material 278 in the form of a strip or other like configuration can provide certain advantages to the spring contact 260. By limiting the amount of coverage of the wear resistant material to only a portion of the contact surface 272, any affect of the coating on the elasticity and/or electrical conductivity of the free portion 262 can be reduced.

The wear resistant material 278 can have any suitable dimensions that provide sufficient coverage over the contact surface 272 to provide the desired wear resistance to the spring contact 260. For example, in some embodiments the width W of the strip can be less than about 0.5 $\mu$m to provide sufficient coverage. The strip can have any suitable length. Preferably, the strip has a length equal to at least the length of the tip 266. Reducing the length of the strip can reduce any effects of the wear resistant material on the elasticity and/or thermal conductivity of the spring contact 260.

Figure 6:
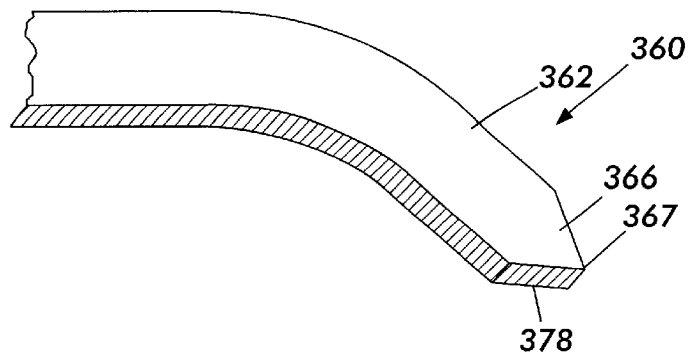
FIG. 6 illustrates another exemplary embodiment of a spring contact according to this invention having a wear resistant material formed over the side surfaces and the contact surface.
Figure 7:
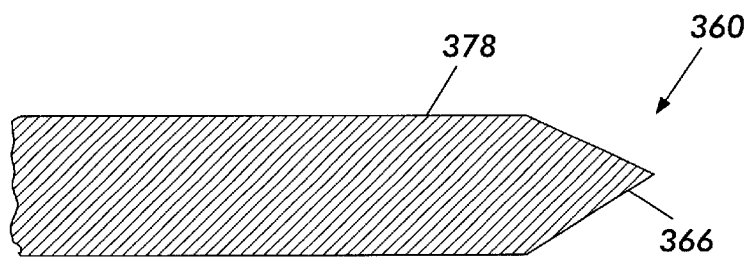
FIG. 7 is a bottom view of the spring contact of FIG. 6.
Figure 8:
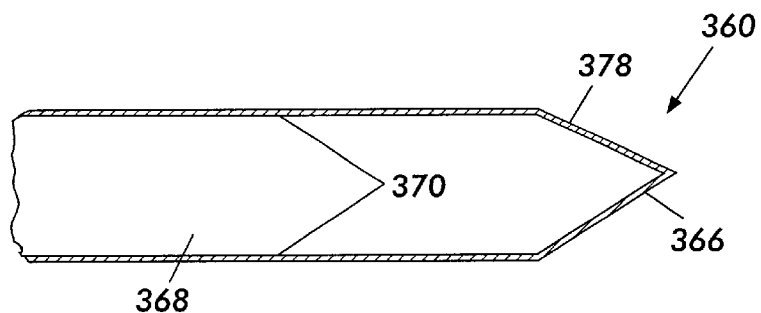
FIG. 8 is a top view of the spring contact of FIG. 6.

FIGS. 6–8 illustrate another exemplary embodiment of a spring contact 360 according to this invention. The spring contact comprises a wear resistant material 378 formed over the entire contact surface as shown in FIG. 7, and also formed over the side surfaces 370 as shown in FIGS. 6 and 8. The spring contact 360 is advantageous because it provides wear resistance to an additional surface area of the spring contact 360. However, as stated above, the overall electrical conductivity of the spring contact 360 can be affected by the electrical conductivity of the wear resistant material, which can be lower than that of the spring metal. Accordingly, in this embodiment, the thickness of the wear resistant material on the contact surface and side surfaces is preferably formed as small as possible to not significantly affect the electrical conductivity of the spring contact 360, but provide the desired wear resistance. For example, the coating can have a thickness of about 0.05 $\mu$m.

Any effect of the wear resistant material on the elasticity and electrical conductivity of the spring contact 360 can also be reduced by applying this material on the contact surface and side surfaces 370 only at the tip 366. Such embodiments enhance the wear resistance of the tip 366 to increase its resistance to blunting, while not significantly affecting the overall elasticity and electrical conductivity of the spring contact 360.

Figure 9:
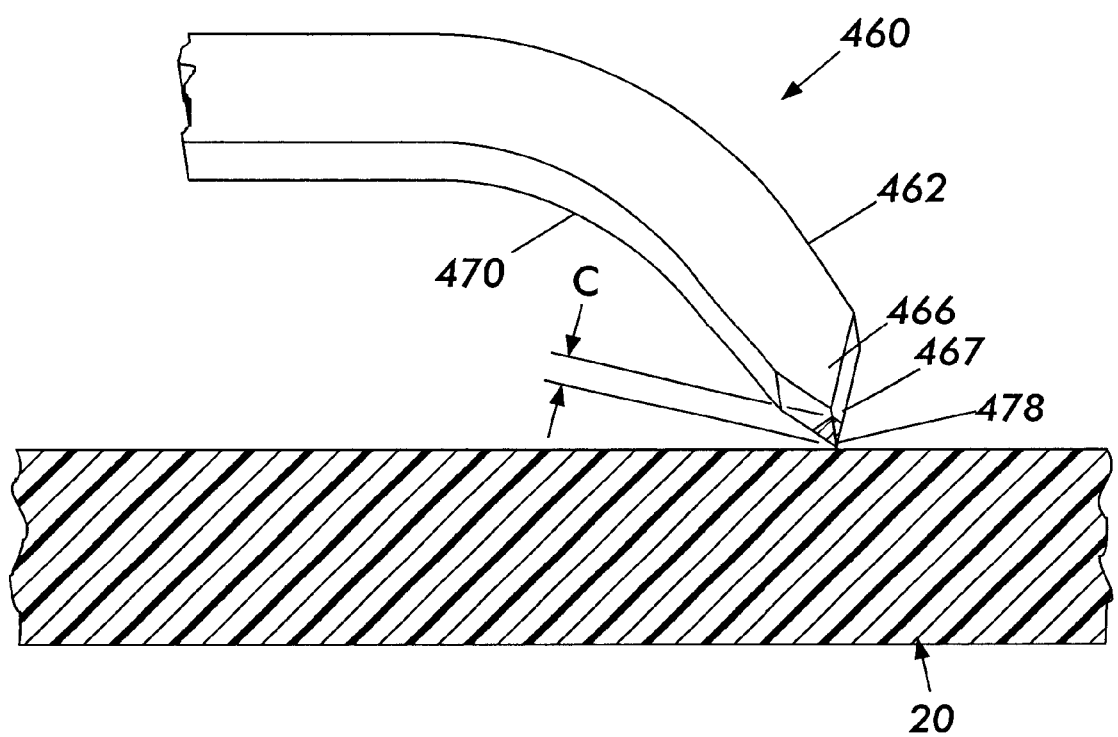
FIG. 9 illustrates another exemplary embodiment of a spring contact according to this invention having a wear resistant material formed on only an end portion of the tip.

FIG. 9 illustrates another exemplary embodiment of a spring contact 460 according to this invention. The spring contact 460 comprises a wear resistant material 478 formed on only a portion of the tip 466. This embodiment is advantageous because the wear resistant material 478 is applied to only a small portion of the spring contact 460 to provide the desired wear resistance. Accordingly, the any effect of this material on the elasticity and electrical conductivity of the spring contact can be at most small.

This invention provides methods of forming the exemplary embodiments of the spring contacts shown in FIGS. 3–9. FIGS. 3, 4, 6 and 9 show that in the spring contacts 160, 260, 360 and 460, respectively, the wear resistant material 178, 278, 378 and 478 is not present on the top surface 162, 262, 362 and 462, respectively. Embodiments of the spring contacts can be formed by photolithography. The spring metal can be formed by any of the methods described in U.S. Pat. Nos. 5,613,861; 5,848,685 and 5,944,537, as well as by other techniques.

Referring to FIG. 3, one exemplary method that can be used to form the spring contact 160 comprises depositing the spring metal as a layer on or over a substrate. The substrate is typically an insulating substrate. An insulating underlaying such as the layer 68 shown in FIG. 1 can optionally be applied over the substrate 52 before applying the spring metal. The spring metal can be formed by any suitable process, which can produce a stress gradient ($\Delta\sigma$/h) from compression at the bottom to tensile at the top of its thickness, where a and h denote the stress and thickness of the spring metal, respectively. For example, the spring metal can be deposited using electronbeam deposition, thermal evaporation, chemical vapor deposition, sputter deposition and other methods known to those skilled in the art. Preferably, the spring metal is sputter deposited because this techniques can produce a reproducible stress gradient with pressure change during deposition.

For example, the spring metal layer can be formed so that it develops a stress gradient that changes from compression at the bottom of the layer to tension at the top of the layer. This stress gradient can be achieved by forming the spring metal as several sub-layers and altering the stress inherent in each sub-layer, by varying the deposition conditions. Once the spring metal is released from the substrate, the inherent stress gradient causes the spring contact to have a curved shape, such as the shape shown in FIG. 1.

The spring metal layer typically has a thickness of about 1 $\mu$m, but can have any suitable thickness.

The wear resistant material is then formed over the spring metal layer. The wear resistant material can be formed by any suitable process. For example, the wear resistant material can be formed over the spring metal layer by reactive magnetron sputtering. As stated above, TiN is an exemplary wear resistant material that provides suitable wear resistance properties for forming spring contacts. A TiN layer can be formed over the spring metal layer by reactive magnetron sputtering, by generating a plasma from $N_2$ or $NH_3$, or by alternatively using a gas mixture of Ar and $N_2$ or $NH_3$.

After the wear resistant material layer is formed over the spring metal layer, these two layers can be patterned using conventional photolithograpic techniques known to those skilled in the art to remove unwanted material to produce the spring contact configuration shown in FIG. 3.

The embodiment of the spring contact 260 shown in FIGS. 4 and 5 can be formed by any suitable process that can deposit the wear resistant material over only a selected portion of the contact surface 272. The spring contact 260 can be formed by first forming a spring metal layer and then forming a wear resistant material over only a selected portion of the spring metal layer by masking the portions of the spring metal that are not to be covered by the wear resistant material.

Alternatively, the wear resistant material can be applied on substantially the entire contact surface of the spring contact and then patterned to form a desired configuration such as the strip configuration shown in FIG. 5. As stated above, the stripe can have any suitable width and length. In addition, multiple strips can optionally be formed on the contact surface. The wear resistant material can have configurations other than a strip configuration, as well.

After the wear resistant material is patterned, the spring metal layer is then patterned to produce a desired configuration such as a strip. However, it will be understood by those skilled in the art that the spring metal layer can alternatively be patterned before the wear resistant material coating is patterned.

The exemplary embodiment of the spring contact 360 according to this invention shown in FIGS. 6–8, having a wear resistant material 378 formed over the contact surface and also on the side surfaces 370, can be formed by forming a spring metal layer, patterning this layer, and then releasing this layer from the substrate so that it bottom and side surfaces are exposed. Next, the wear resistant material layer can be formed over the contact surface and the side surfaces of a selected portion of the spring metal layer by any of the suitable deposition techniques described above. For example, the wear resistant material can be deposited over the spring metal layer by a plasma enhanced chemical vapor deposition (PECVD) process, using any suitable gas precursor to form the desired coating composition.

Referring to FIG. 9, the exemplary embodiment of the spring contact 460 according to this invention comprises a wear resistant material 478 formed on only the pointed end 467 of the tip 466. The wear resistant material 478 can be formed using a carburizing process that can selectively carburize only a portion of the tip of the spring metal layer to form a metal carbide. For example, after the spring metal layer is formed by a suitable deposition process and patterning, the tip of the spring metal can be brought into contact with a solid graphite source, such as a graphite plate. The tip and graphite source are then heated to a temperature that is effective to cause the spring metal material and the graphite to form a carbide. For example, titanium spring metal and graphite form TiC at the pointed end of the tip in contact with the graphite source at a temperature typically of about 800° C., forming the metal carbide and metal solid solution by solid-state diffusion. The carburized region of the tip can typically have a dimension C of less than about 0.2 µm.

In this embodiment, the carburizing temperature is preferably minimized to reduce any effect of the temperature on the stress pattern of the spring metal. This can be achieved by utilizing spring metals that can form metal carbides at lower temperatures.

In addition, in some embodiments, the portion of the spring metal that is not in contact with the graphite source can be cooled so that the temperature of the cooled portion is kept lower than the temperature at the pointed tip in contact with the graphite during the carburizing. In such embodiments, the graphite source such as a graphite block can be selectively heated while not applying heat to the spring metal. Although heat is conducted into the spring metal from the graphite source, by simultaneously cooling the spring metal, the spring metal temperature can be controlled to reduce or control stress release effects.

Any suitable post annealing techniques can be used to remove any undesired stress effects in the spring contacts caused by the carburizing.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. A spring contact, comprising:
   an anchor portion fixed to a substrate;
   a free portion comprising a spring metal and including a tip having a top surface, side surfaces and a contact surface opposite to the top surface; and
   a ceramic wear resistant material on the side surfaces and the contact surface of the tip, the ceramic wear resistant material not being on the top surface.

2. The spring contact of claim 1, wherein the ceramic wear resistant material is TiN.

3. A probe card comprising a plurality of the spring contacts according to claim 1.

4. A method of testing an object including a contact pad having an oxide on a surface of the contact pad, comprising bringing the tip of the spring contact according to claim 1 into contact with the oxide to penetrate the oxide and make electrical contact with the surface.

5. The spring contact of claim 1, wherein the spring contact has a width of 10–100 µm, and the wear resistant material has a thickness of from about 0.05 µm to about 0.2 µm.

6. The spring contact of claim 1, wherein the free portion consists essentially of the spring metal and the wear resistant material.

7. A spring contact, comprising:
   an anchor portion fixed to a substrate; and
   a free portion consisting essentially of a spring metal and a wear resistant material, the free portion including a tip having a contact surface with a width;
   wherein the wear resistant material is on the contact surface of the tip, the wear resistant material has a strip configuration and the strip has a width less than the width of the contact surface.

8. The spring contact of claim 7, wherein the wear resistant material is a ceramic.

9. The spring contact of claim 7, wherein the wear resistant material is TiN.

10. The spring contact of claim 7, wherein the wear resistant material is a metal.

11. The spring contact of claim 7, wherein the strip has a length equal to about the length of the spring contact.

12. A probe card comprising a plurality of the spring contacts according to claim 7.

13. A method of testing an object including a contact pad having an oxide on a surface of the contact pad, comprising bringing the tip of the spring contact according to claim 7 into contact with the oxide to penetrate the oxide and make electrical contact with the surface.

14. The spring contact of claim 5, wherein the strip has a width of less than about 0.5 µm.

15. The spring contact of claim 7, wherein the spring contact has a width of 10–100 µm, and the wear resistant material has a thickness of from about 0.05 µm to about 0.2 µm.

16. A method of making a spring contact, comprising:
   forming a spring metal layer including an anchor portion fixed to a substrate and a free portion, the free portion including a tip having a top surface, side surfaces and a contact surface opposite to the top surface; and
   forming a ceramic wear resistant material on the side surfaces and the contact surface, the ceramic wear resistant material not being formed on the top surface.

17. The method of claim 16, wherein the spring contact has a width of 10–100 µm, and the wear resistant material has a thickness of from about 0.05 µm to about 0.2 µm.

18. The method of claim 16, wherein the free portion consists essentially of the spring metal layer and the wear resistant material.

19. A method of making a spring contact, comprising:
   forming a spring metal layer including an anchor portion fixed to a substrate and a free portion, the free portion including a tip having a contact surface with a width; and
   forming a wear resistant material on the contact surface of the tip, the free portion consisting essentially of the spring metal layer and the wear resistant material;
   wherein the wear resistant material has a strip configuration and the strip has a width less than the width of the contact surface.

20. The method of claim 19, wherein the wear resistant material is a ceramic.

21. The method of claim 19, wherein the wear resistant material is metal.

22. The method of claim 19, wherein the spring contact has a width of 10–100 µm, and the wear resistant material has a thickness of from about 0.05 µm to about 0.2 µm.

23. A spring contact, comprising:

an anchor portion fixed to a substrate;

a free portion comprising a spring metal, the free portion including a tip having an end portion; and a wear resistant carbide formed by a carburizing process and on only the end portion of the tip.

24. The spring contact of claim 23, wherein the end portion of the tip is pointed.

25. The spring contact of claim 23, wherein the spring contact has a width of 10–100 µm.

26. The spring contact of claim 23, wherein the free portion consists essentially of the spring metal and the wear resistant carbide.

27. A method of making a spring contact, comprising:

forming a spring metal layer including an anchor portion fixed to a substrate and a free portion, the free portion including a tip having an end portion; and forming a wear resistant carbide by a carburizing process on only the end portion of the tip.

28. The method of claim 27, wherein the end portion of the tip is pointed.

29. The method of claim 27, wherein the spring contact has a width of 10–100 µm.

30. The method of claim 27, wherein the free portion consists essentially of the spring metal layer and the wear resistant carbide.

31. A spring contact, comprising:

an anchor portion fixed to a substrate; and a free portion comprising a spring metal and a ceramic wear resistant material, the free portion including a tip having a contact surface with a width;

wherein the ceramic wear resistant material is formed on the contact surface of the tip, the ceramic wear resistant material has a strip configuration and the strip has a width less than the width of the contact surface.

* * * * *

UNITED STATES PATENT AND TRADEMARK OFFICE
CERTIFICATE OF CORRECTION

| | | |
|---|---|---|
| PATENT NO. | : 6,352,454 B1 | Page 1 of 1 |
| APPLICATION NO. | : 09/421389 | |
| DATED | : March 5, 2002 | |
| INVENTOR(S) | : Patrick G. Kim et al. | |

It is certified that error appears in the above-identified patent and that said Letters Patent is hereby corrected as shown below:

Column 1, line 2, insert as a new paragraph:

This invention was made with Government support under 70NANB8H4008 awarded by NIST. The Government has certain rights in this invention.

Signed and Sealed this

First Day of May, 2007

JON W. DUDAS
*Director of the United States Patent and Trademark Office*